(12) United States Patent
Rodder et al.

(10) Patent No.: US 9,490,323 B2
(45) Date of Patent: Nov. 8, 2016

(54) NANOSHEET FETS WITH STACKED NANOSHEETS HAVING SMALLER HORIZONTAL SPACING THAN VERTICAL SPACING FOR LARGE EFFECTIVE WIDTH

(71) Applicant: Samsung Electronics Co., Ltd., Suwon-si (KR)

(72) Inventors: Mark S. Rodder, Dallas, TX (US); Borna J. Obradovic, Leander, TX (US); Rwik Sengupta, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/722,402

(22) Filed: May 27, 2015

(65) Prior Publication Data

US 2015/0364546 A1    Dec. 17, 2015

Related U.S. Application Data

(60) Provisional application No. 62/012,191, filed on Jun. 13, 2014.

(51) Int. Cl.
*H01L 29/06* (2006.01)
*H01L 29/10* (2006.01)
(Continued)

(52) U.S. Cl.
CPC .......... *H01L 29/1037* (2013.01); *B82Y 10/00* (2013.01); *B82Y 40/00* (2013.01);
(Continued)

(58) Field of Classification Search
CPC ................................ H01L 29/42392
See application file for complete search history.

(56) References Cited

U.S. PATENT DOCUMENTS 8,106,383 B2   1/2012 Jenkins et al.
8,199,456 B2   6/2012 Lim et al.
(Continued)

FOREIGN PATENT DOCUMENTS

WO    WO 2013/057732 A2    4/2013

OTHER PUBLICATIONS

Balendhran S. "Devices and systems based on two dimensional MoO3 and MoS2", Thesis submitted in fulfillment of the requirements for the degree of Doctor of Philosophy; School of Electrical and Computer Engineering: RMIT University; Aug. 2013, Retrieved from the internet at URL: http://researchbank.rmit.edu.au/eserv/rmit:160553/Balendhran.pdf.
(Continued)

*Primary Examiner* — Peniel M Gumedzoe
*Assistant Examiner* — Christopher Johnson
(74) *Attorney, Agent, or Firm* — Myers Bigel & Sibley, P.A.

(57) ABSTRACT

A device including a stacked nanosheet field effect transistor (FET) may include a substrate, a first channel pattern on the substrate, a second channel pattern on the first channel pattern, a gate that is configured to surround portions of the first channel pattern and portions of the second channel pattern, and source/drain regions on opposing ends of the first channel pattern and second channel pattern. The first and second channel patterns may each include a respective plurality of nanosheets arranged in a respective horizontal plane that is parallel to a surface of the substrate. The nanosheets may be spaced apart from each other at a horizontal spacing distance between adjacent ones of the nanosheets. The second channel pattern may be spaced apart from the first channel pattern at a vertical spacing distance from the first channel pattern to the second channel pattern that is greater than the horizontal spacing distance.

18 Claims, 8 Drawing Sheets

(51) Int. Cl.
*H01L 27/092* (2006.01)
*H01L 29/423* (2006.01)
*B82Y 10/00* (2011.01)
*B82Y 40/00* (2011.01)
*H01L 29/66* (2006.01)
*H01L 29/775* (2006.01)
*H01L 29/16* (2006.01)
*H01L 21/8238* (2006.01)

(52) U.S. Cl.
CPC ..... *H01L21/823807* (2013.01); *H01L 27/092* (2013.01); *H01L 29/0665* (2013.01); *H01L 29/0673* (2013.01); *H01L 29/16* (2013.01); *H01L 29/42356* (2013.01); *H01L 29/66439* (2013.01); *H01L 29/775* (2013.01); *H01L 27/0924* (2013.01)

(56) References Cited

U.S. PATENT DOCUMENTS

| | | |
|---|---|---|
| 8,686,428 B1 | 4/2014 | Sekar et al. |
| 8,691,324 B2 | 4/2014 | Wu et al. |
| 8,753,965 B2 | 6/2014 | Avouris et al. |
| 8,778,768 B1* | 7/2014 | Chang ............... H01L 29/42392 257/213 |
| 2011/0053361 A1* | 3/2011 | Muralidhar ......... H01L 21/3086 438/585 |
| 2013/0069041 A1 | 3/2013 | Zhu et al. |
| 2013/0082241 A1 | 4/2013 | Kub et al. |
| 2013/0299782 A1 | 11/2013 | Afzali-Ardakani et al. |
| 2014/0051213 A1* | 2/2014 | Chang ................... B82Y 10/00 438/151 |
| 2014/0063744 A1 | 3/2014 | Lopez et al. |
| 2014/0103414 A1 | 4/2014 | Koldiaev et al. |
| 2014/0138626 A1 | 5/2014 | Farmer et al. |
| 2014/0197459 A1 | 7/2014 | Kis et al. |

OTHER PUBLICATIONS

Yu et al. "Vertically stacked multi-heterostructures of layered materials for logic transistors and complementary inverters", *Nature Materials*, vol. 12, Mar. 2013, pp. 246-252, Retrieved from URL: http://www.nature.com/nmat/journal/v12/n3/full/nmat3518.html.

* cited by examiner

NANOSHEET FETS WITH STACKED NANOSHEETS HAVING SMALLER HORIZONTAL SPACING THAN VERTICAL SPACING FOR LARGE EFFECTIVE WIDTH

CROSS-REFERENCE TO RELATED APPLICATION

This application claims priority under 35 U.S.C. §120 to U.S. Provisional Application Ser. No. 62/012,191, entitled NANOSHEET FET WITH STACKED NANOSHEETS HAVING SMALLER HORIZONTAL SPACING THAN VERTICAL SPACING FOR LARGE EFFECTIVE WIDTH, filed in the USPTO on Jun. 13, 2014, the disclosure of which is incorporated herein by reference in its entirety.

FIELD

Some embodiments of the inventive concept relate generally to semiconductor devices and, more particularly, to field-effect transistor semiconductor devices with stacked nanosheets.

BACKGROUND

Vertical fin-based field-effect transistor (finFET) devices have been developed that include multiple vertical fins serving as conducting channel regions to enable larger effective conduction width in a small layout area overlying a substrate. However, as circuits are scaled to smaller dimensions and thus a smaller area, the required lateral spacing between adjacent vertical fins may become too small to enable the vertical finFET devices to operate properly. A main reason for this limitation is that it is difficult to form the desired metal thicknesses between the adjacent fins along the height of the vertical fins, which may have a height in a range of about 35 nm to about 50 nm, in particular, it may be difficult to form either or both of a work-function tuning metal and a low-resistance capping; metal of a metal portion of a gate stack in the small lateral spacing between the fins. If the low-resistance capping metal is not fully formed along the about 35-50 nm height of the vertical fins, then a large gate resistance may occur that may cause a circuit including the vertical finFET to have reduced AC performance. If the work-function tuning metal is not formed or not fully formed along the about 35-50 nm height of the vertical fins, then the vertical finFET may be inoperable due either to no gate control of the channel potential, for example, no transistor action, or ill-centered and/or uncontrolled threshold voltage, VT.

Reference is now made to FIG. 1, which is a cross sectional view schematically illustrating a conventional vertical finFET semiconductor device. A conventional vertical finFET semiconductor device 100 may include a substrate 150. The conventional vertical finFET semiconductor device 100 may also include multiple vertical fins 110 that serve as channel regions of the conventional vertical finFET semiconductor device 100. Adjacent ones of the multiple vertical fins 110 may be separated by a horizontal spacing distance h in a dimension parallel to a surface of the substrate 150. The conventional vertical finFET semiconductor device 100 may include a gate stack on top surfaces of the vertical fins 110 and extending down sidewall surfaces of the vertical fins 110. The gate stack may include gate dielectric layers 120 formed on the top surfaces and sidewall surfaces of the vertical fins 110. The gate stack may include work function tuning metal layers 130 formed on the gate dielectric layers 120. The gate stack may include a low resistance gate metal layer 140 formed on the work function tuning metal layers 130. A minimum of the horizontal spacing distance h separating adjacent ones of the multiple vertical fins 110 of the conventional vertical finFET semiconductor device 100 may be limited to a minimum distance required to form the gate dielectric layers 120 and work function tuning metal layers 130 on the sidewall surfaces of the vertical fins 110, as illustrated in FIG. 1, The minimum of the horizontal spacing distance h of the conventional finFET may limit a minimum size of the vertical finFET semiconductor device 100. An effective channel conduction width of the conventional vertical finFET semiconductor device 100 may be approximately equal to a sum of lengths of the surfaces of the vertical fins 110 that are surrounded by the low resistance gate material metal layer 140. For example, the effective channel conduction width of the conventional vertical finFET semiconductor device 100 may be approximately equal to a sum of lengths of the top surfaces and sidewall surfaces of the vertical fins 110 that are surrounded by the low resistance gate material metal layer 140.

SUMMARY

According to some embodiments of the inventive concept, devices are provided. A device may include a field effect transistor (FET). The FET may include a substrate, a first channel pattern on the substrate, a second channel pattern on the first channel pattern, a gate that is configured to surround portions of the first channel pattern and portions of the second channel pattern, and source/drain regions on opposing ends of the first channel pattern and second channel pattern, The first channel pattern may include a first plurality of nanosheets arranged in a first horizontal plane that is parallel to a surface of the substrate. The first plurality of nanosheets may be spaced apart from each other in a first direction that is parallel to the surface of the substrate at a horizontal spacing distance between adjacent ones of the first plurality of nanosheets. The second channel pattern may be spaced apart from the first channel pattern in a second direction that is perpendicular to the surface of the substrate at a vertical spacing distance from the first channel pattern to the second channel pattern that is greater than the horizontal spacing distance. The second channel pattern may include a second plurality of nanosheets arranged in a second horizontal plane that is parallel to the surface of the substrate. The second plurality of nanosheets may be spaced apart from each other in the first direction at the horizontal spacing distance between adjacent ones of the second plurality of nanosheets. Ones of the source/drain regions may be connected to a respective end of the first channel pattern and a. respective corresponding end of the second channel pattern.

Ones of the first plurality of nanosheets and ones of the second plurality of nanosheets may include a ratio of width in the first direction to height in the second direction of at least 1:1.

Ones of the first plurality of nanosheets and ones of the second plurality of nanosheets may include a ratio of width in the first direction to height in the second direction of at least 2:1.

Ones of the first plurality of nanosheets and ones of the second plurality of nanosheets may include a height in the second direction in a range of about 2 nm to about 8 nm.

Ones of the first plurality of nanosheets and ones of the second plurality of nanosheets may include a height in the second direction in a range of about 3 nm to about 6 nm.

The gate may include a gate dielectric material that is configured to surround portions of ones of the first plurality of nanosheets and portions of ones of the second plurality of nanosheets. The gate may include a low resistance gate metal layer on the gate dielectric material that is configured to surround portions of the first channel pattern and portions of the second channel pattern. The gate dielectric material may extend substantially continuously between adjacent ones of the first plurality of nanosheets and may extend substantially continuously between adjacent ones of the second plurality of nanosheets.

The gate may further include a work function tuning metal layer between the low resistance gate metal layer and the gate dielectric material. The work function tuning metal layer may be configured to control a work function of the FET.

The first channel pattern may include two nanosheets. The second channel pattern may include two nanosheets.

The gate may include a gate dielectric material that is configured to surround portions of ones of the first plurality of nanosheets and portions of ones of the second plurality of nanosheets. The gate may include a work function tuning metal layer that is configured to surround portions of the gate dielectric material. The work function tuning metal layer may he configured to control a work function of the FET. The gate may include a low resistance gate metal layer on the work function tuning metal layer that is configured to surround portions of the first channel pattern and portions of the second channel pattern. The work function tuning metal layer may extend substantially continuously between adjacent ones of the first plurality of nanosheets and may extend substantially continuously between adjacent ones of the second plurality of nanosheets. The first channel pattern may include at least three nanosheets. The second channel pattern may include at least three nanosheets.

The gate may include a gate dielectric material that is configured to surround portions of ones of the first plurality of nanosheets and portions of ones of the second plurality of nanosheets. The gate may include a low resistance gate metal layer on the gate dielectric material that is configured to surround top and bottom surfaces of portions of the first channel pattern and top and bottom surfaces of portions of the second channel pattern.

The low resistance gate metal layer may further surround outer edges of outer nanosheets of the portions of ones of the first channel pattern and outer edges of outer nanosheets of the portions of ones of the second channel pattern.

The FET may be an n-type FET. The device may further include a p-type FET. The p-type FET may include a third channel pattern on the substrate. The third channel pattern may include a third plurality of nanosheets spaced apart from each other at a second horizontal spacing distance between adjacent ones of the first plurality of nanosheets. The p-type FET may include a fourth channel pattern on the third channel pattern and spaced apart from the third channel pattern in the second direction at a second vertical spacing distance from the third channel pattern to the fourth channel pattern that is greater than the second horizontal spacing distance. The fourth channel pattern may include a fourth plurality of nanosheets spaced apart from each other at the second horizontal spacing distance between adjacent ones of the fourth plurality of nanosheets. The nanosheets of the first through fourth channel patterns may include Si, SiGe, Ge, or a group III-V semiconductor material. Top and bottom surfaces of the nanosheets of the first channel pattern and second channel pattern may include a first surface orientation. Top and bottom surfaces of the nanosheets of the third channel pattern and the fourth channel pattern may include a second surface orientation.

The first surface orientation may be the same as the second surface orientation.

The first surface orientation and second surface orientation may be (110).

The first surface orientation may be different from the second surface orientation.

The first surface orientation may be (100) or (111) and the second surface orientation may be (110).

According to other embodiments of the inventive concept, field effect transistors (FETs) are provided. A FET may include a substrate, a first channel pattern on the substrate, a second channel pattern on the first channel pattern and spaced apart from the first channel pattern in a second direction that is perpendicular to the surface of the substrate, a gate that is configured to surround portions of the first channel pattern and portions of the second channel pattern, and source/drain regions on opposing ends of the first channel pattern and second channel pattern. The first channel pattern may include a first plurality of nanosheets arranged in a first horizontal plane that is parallel to a surface of the substrate. The first plurality of nanosheets may be spaced apart from each other in a first direction that is parallel to the surface of the substrate. The second channel pattern may include a second plurality of nanosheets arranged in a second horizontal plane that is parallel to the surface of the substrate. The second plurality of nanosheets may be spaced apart from each other in the first direction. The gate may include a gate dielectric material that is configured to surround portions of ones of the first plurality of nanosheets and portions of ones of the second plurality of nanosheets. The gate may include a low resistance gate metal layer on the gate dielectric material that is configured to surround portions of the first channel pattern and portions of the second channel pattern. The gate dielectric material may be configured to extend substantially continuously between adjacent ones of the first plurality of nanosheets and may be configured to extend substantially continuously between adjacent ones of the second plurality of nanosheets. Ones of the source/drain regions may be connected to a respective end of the first channel pattern and a respective corresponding end of the second channel pattern.

The first channel pattern may include two nanosheets. The second channel pattern may include two nanosheets.

According to other embodiments of the inventive concept, field effect transistors (FETs) are provided. A FET may include a substrate, a first channel pattern on the substrate, a second channel pattern on the first channel pattern and spaced apart from the first channel pattern in a second direction that is perpendicular to the surface of the substrate, a gate that is configured to surround portions of the first channel pattern and portions of the second channel pattern, and source/drain regions on opposing ends of the first channel pattern and second channel pattern. The first channel pattern may include a first plurality of nanosheets arranged in a first horizontal plane that is parallel to a surface of the substrate. The first plurality of nanosheets may be spaced apart from each other in a first direction that is parallel to the surface of the substrate. The second channel pattern may include a second plurality of nanosheets arranged in a second horizontal plane that is parallel to the surface of the substrate, The second plurality of nanosheets may be spaced apart from each other in the first direction. The gate may include a gate dielectric material that is configured to surround portions of ones of the first plurality of nanosheets and portions of ones of the second plurality of nanosheets. The gate may include a work function tuning metal layer that is configured to surround portions of the gate dielectric material and configured to control a work function of the FET. The gate may include a low resistance gate metal layer on the work function tuning metal layer that is configured to surround portions of the first channel pattern and portions of the second channel pattern. The work function tuning metal layer may be configured to extend substantially continuously between adjacent ones of the first plurality of nanosheets and may be configured to extend substantially continuously between adjacent ones of the second plurality of nanosheets. Ones of the source/drain regions connected to a respective end of the first channel pattern and a respective corresponding end of the second channel pattern.

The first channel pattern may include at least three nanosheets. The second channel pattern may include at least three nanosheets.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION OF THE EMBODIMENTS

Figure 1:
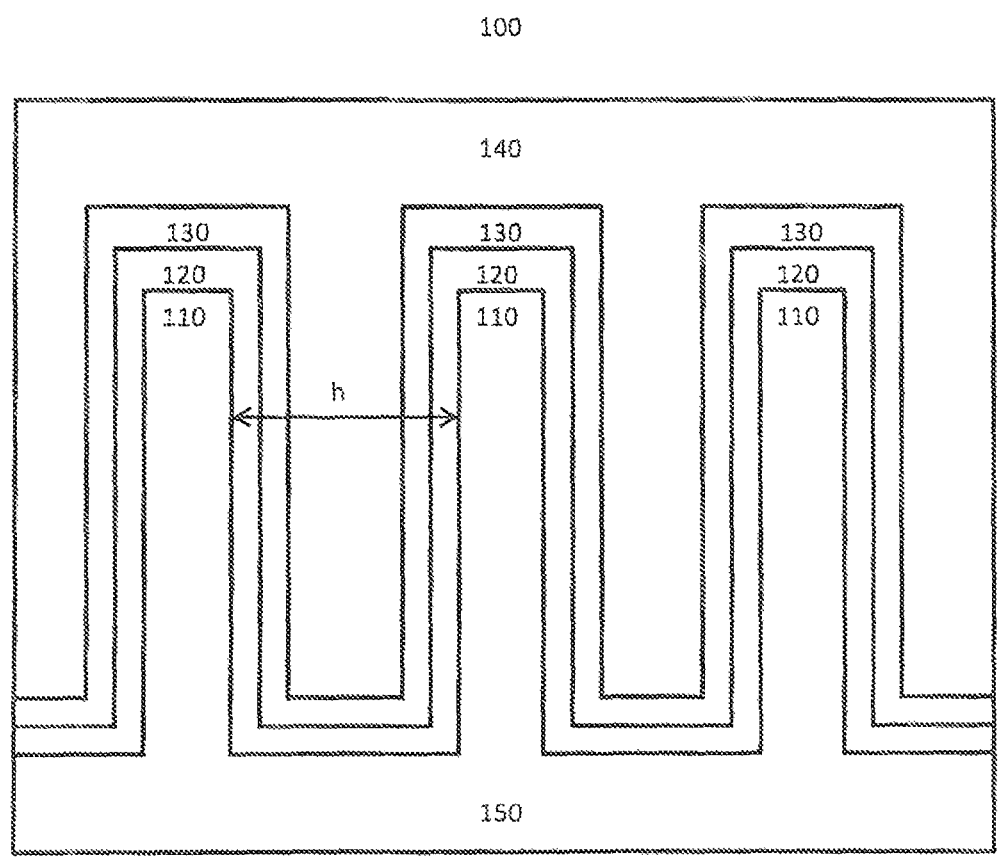
FIG. 1 is a cross sectional view schematically illustrating a conventional vertical finFET semiconductor device.

Embodiments are described in detail with reference to the accompanying drawings. The inventive concept, however, may be embodied in various different forms, and should not be construed as being limited only to the illustrated embodiments set forth. herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. It will be further understood that when an element such as a layer, region or surface is referred to as being "adjacent" another element, it can be directly adjacent the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in sonic embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices according to various embodiments described herein may be embodied in microelectronic devices, such as integrated circuits, wherein a plurality of devices according to various embodiments described herein are integrated in the same microelectronic device, Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Figure 2A:
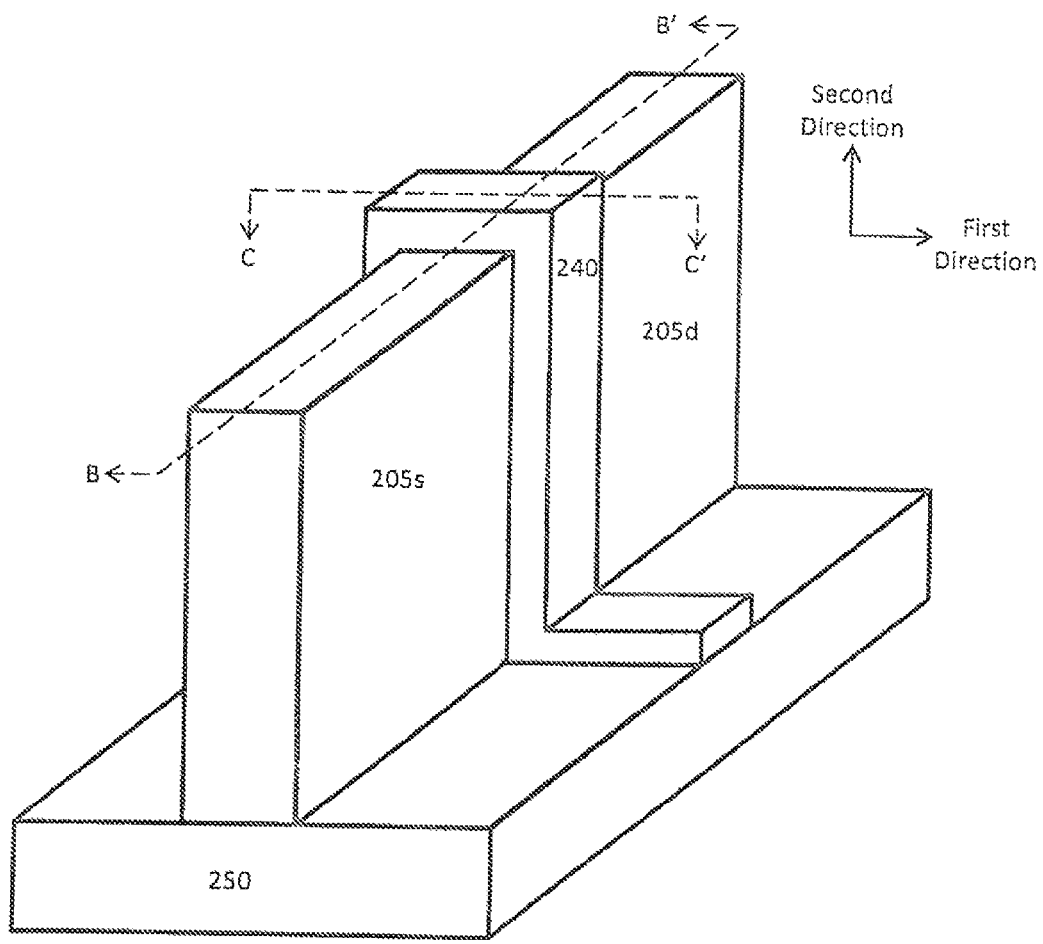
FIG. 2A is a prospective view schematically illustrating a stacked nanosheet FET semiconductor device according to some embodiments of the inventive concept.
Figure 2B:
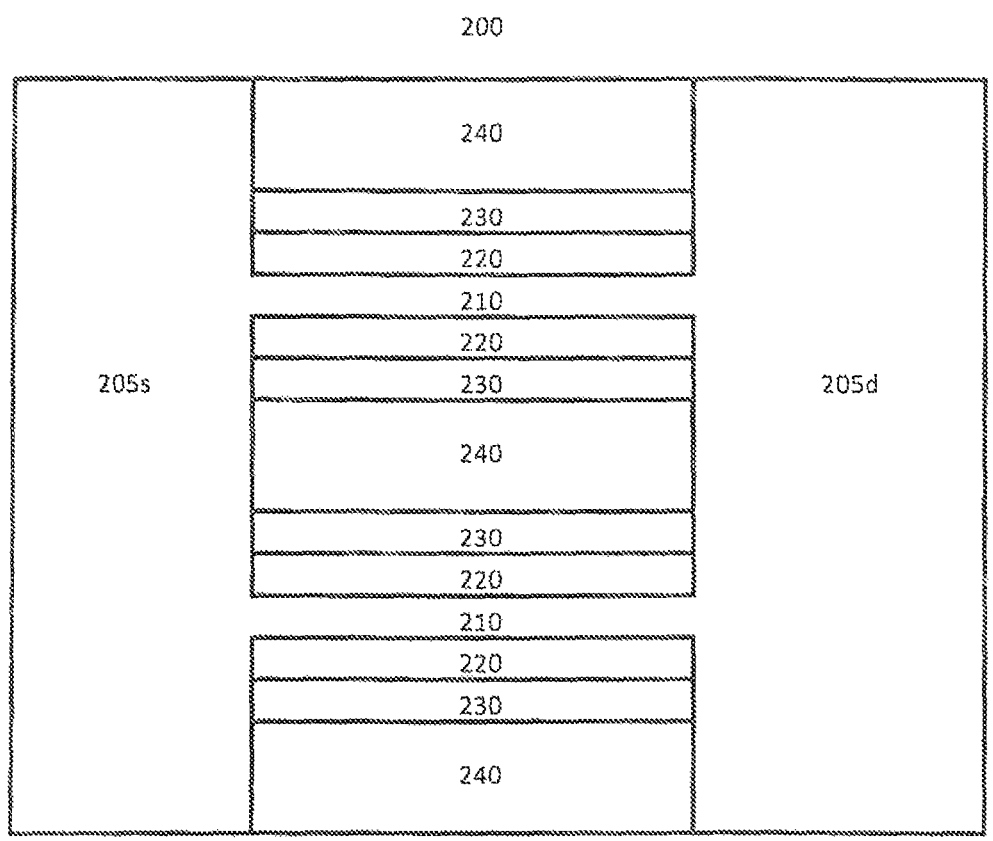
FIG. 2B is a cross-sectional view taken along the line B-B' of FIG. 2A.
Figure 2C:
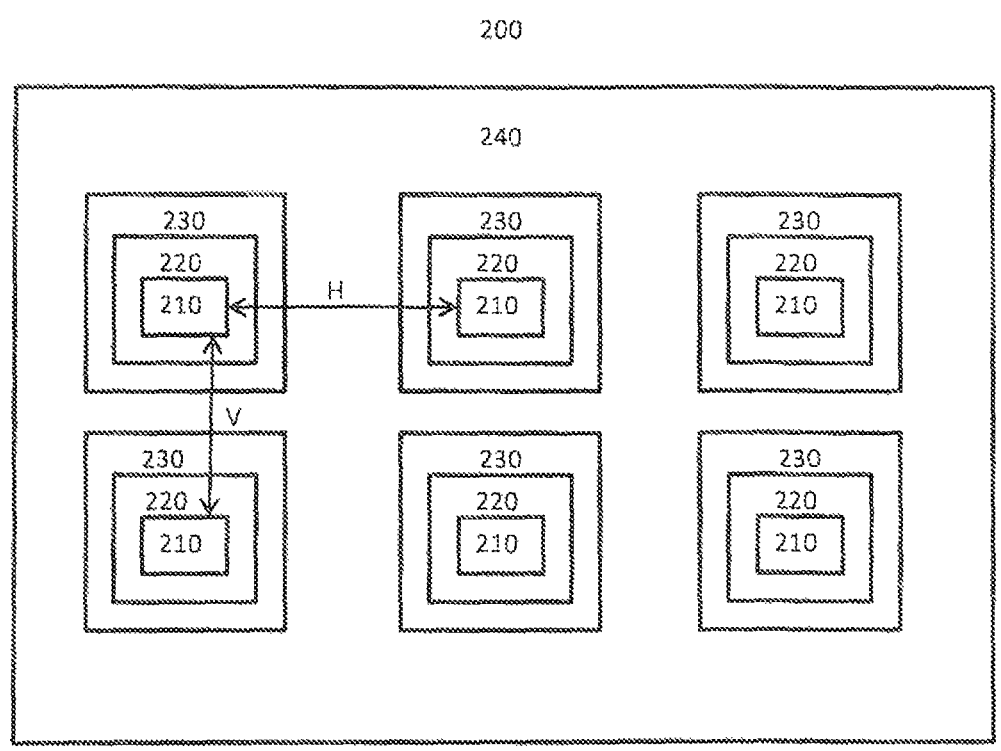
FIG. 2C is a cross-sectional view taken along the line C-C of FIG. 2A.

Reference is now made to FIGS. 2A, 2B, and 2C, which are a prospective view schematically illustrating a stacked nanosheet FET semiconductor device, a cross-sectional view taken along the line B-B' of FIG. 2A, and a cross-sectional view taken along the line C-C' of FIG. 2A, respectively, according to some embodiments of the inventive concept. In some embodiments, a stacked nanosheet FET semiconductor device 200 may include a substrate 250. The stacked nanosheet FET semiconductor device 200 may include a plurality of vertically stacked channel patterns. Ones of the channel patterns may comprise a plurality of nanosheets 210 arranged in a horizontal plane that is parallel to a surface of the substrate 250. The plurality of stacked channel patterns may perform a function of a channel of the stacked nanosheet FET semiconductor device 200. In other words, the plurality of nanosheets 210 may perform the function of the channel of the stacked nanosheet FET semiconductor device 200.

Although two vertically stacked channel patterns are illustrated in FIGS. 2B and 2C, more vertically stacked channel patterns may be provided. For example, in some embodiments, the plurality of vertically stacked channel patterns may include three or more vertically stacked channel patterns. Although each of the vertically stacked channel patterns illustrated in FIGS. 2B and 2C include three nanosheets 210, a greater or lesser number of nanosheets 210 may be provided. For example, in some embodiments, ones of the plurality of vertically stacked channel patterns may include three or more nanosheets 210. In some embodiments, ones of the plurality of vertically stacked channel patterns may include two nanosheets 210.

Ones of the nanosheets 210 may include a thin layer of conducting channel material. For example, in some embodiments, ones of the nanosheets 210 may include Si, SiGe, Ge, and/or a group III-V semiconductor material, for example InGaAs, InAs, or InSb, but the inventive concept is not limited thereto. In some embodiments, a width of ones of the plurality of nanosheets 210 may be in a range of about 10 nm to about 30 nm in a first direction that is parallel to the surface of the substrate 250. In some embodiments, a thickness of ones of the plurality of nanosheets may be in a range of about 2 nm to about 8 nm in a second direction that is perpendicular to the surface of the substrate 250. in some embodiments, a thickness of ones of the plurality of nanosheets may be in a range of about 3 nm to about 6 nm in the second direction that is perpendicular to the surface of the substrate 250.

in some embodiments, a ratio of the width of the ones of the plurality of nanosheets 210 to the thickness of the ones of the plurality of nanosheets 210 may be at least 1:1. In some embodiments, a ratio of the width of the ones of the plurality of nanosheets 210 to the thickness of the ones of the plurality of nanosheets 210 may be at least 2:1. In some embodiments, a ratio of the width of the ones of the plurality of nanosheets 210 to the thickness of the ones of the plurality of nanosheets 210 may be at least 3:1.

Ones of the plurality of nanosheets 210 in a horizontal plane may be spaced apart from each other in the first direction that is parallel to the surface of the substrate 250 at a horizontal spacing distance H between adjacent ones of the plurality of nanosheets 210. Ones of the plurality of vertically stacked channel patterns may be spaced apart from each other in the second direction that is perpendicular to the surface of the substrate 250 at a vertical spacing distance V between adjacent ones of the plurality of vertically stacked channel patterns. In other words, ones of the plurality of nanosheets 210 of a first channel pattern may be spaced apart from respective ones of the plurality of nanosheets 210 of an adjacent second channel pattern in the second direction at the vertical spacing distance V. In some embodiments, the horizontal spacing distance H may be less than the vertical spacing distance V. In some embodiments, ones of the plurality of nanosheets 210 of the first channel pattern may be aligned with the respective ones of the plurality of nanosheets 210 of the adjacent second channel pattern in the second direction, but the inventive concept is not limited thereto. For example, in other embodiments, ones of the plurality of nanosheets 210 of the first channel pattern may be offset from the respective ones of the plurality of nanosheets 210 of the adjacent second channel pattern in one or more directions. In some embodiments, the first channel pattern may have a fewer or greater number of nanosheets 210 than the adjacent second channel pattern and/or the ones of the plurality of nanosheets 210 of the first channel pattern may have a different thickness, width, and/or horizontal spacing distance H than the ones of the plurality of nanosheets 210 of the adjacent second channel pattern.

The stacked nanosheet FET semiconductor device 200 may include a gate stack surrounding portions of the plurality of vertically stacked channel patterns. The gate stack may perform a function of a gate of the stacked nanosheet FET semiconductor device 200. The gate stack may include a gate dielectric material 220 surrounding portions of ones of the plurality of nanosheets 210 of the plurality of vertically stacked channel patterns. For example, the gate dielectric material 220 may surround top, bottom, and/or sidewall surfaces of ones of the plurality of nanosheets 210 of the plurality of vertically stacked channel patterns. The gate dielectric material 220 may electrically insulate the plurality of nanosheets 210 from electrically conductive portions of the gate stack.

The gate stack may include a low resistance gate metal layer 240 surrounding portions of the plurality of vertically stacked channel patterns. The low resistance gate metal layer 240 may extend on the gate dielectric material 220 between adjacent ones of the plurality of vertically stacked channel patterns. The low resistance gate metal layer 240 may surround top and bottom surfaces of portions of ones of the plurality of vertically stacked channel patterns, In other words, the low resistance gate metal layer 240 may surround top and bottom surfaces of portions of ones of the plurality of nanosheets 210 of the ones of the plurality of vertically stacked channel patterns. The low resistance gate metal layer 240 may further surround outer edges of outer ones of the ones of the plurality of nanosheets 210 of the ones of the plurality of vertically stacked channel patterns. In some embodiments, the low resistance gate metal layer 240 may extend between horizontally adjacent ones of the plurality of nanosheets 210, but the inventive concept is not limited thereto. In some embodiments, the gate dielectric material 220 may electrically insulate the plurality of nanosheets 210 from the low resistance gate metal layer 240, In some embodiments, the gate stack may include a work function tuning metal layer 230 between the low resistance gate metal layer 240 and the gate dielectric. material 220, but the inventive concept is not limited thereto. For example, in some embodiments, the gate stack may not include a work function tuning metal layer 230. The work function tuning metal layer 230 may extend between adjacent ones of the plurality of vertically stacked channel patterns. In some embodiments, the work function tuning metal layer 230 may extend between horizontally adjacent ones of the plurality of nanosheets 210, but the inventive concept is not limited thereto. The work function tuning metal layer 230 may control a work function of the stacked nanosheet FET semiconductor device 200. In some embodiments, the gate dielectric material 220 may electrically insulate the plurality of nanosheets 210 from the low resistance gate metal layer 240 and/or the work function tuning metal layer 230.

The stacked nanosheet FET semiconductor device 200 may include a source region 205s and a drain region 205d on opposing ends attic plurality of vertically stacked channel patterns. The source region 205s and the drain region 205d may be connected to respective ends of ones of the plurality of vertically-stacked channel patterns, In other words, the source region 205s and the drain region 205d may he connected to respective ends of ones of the plurality of nanosheets 210 of the ones of the plurality of vertically stacked channel patterns. The source region 205s may perform a function of a source of the stacked nanosheet FET semiconductor device 200. The drain region 205d may perform a function of a drain of the stacked nanosheet FET semiconductor device 200.

In some embodiments, a minimum of the horizontal spacing distance H of the stacked nanosheet FET semiconductor device 200 may be limited to a minimum distance required to form the gate stack between horizontally adjacent ones of the plurality of nanosheets 210. In other words, in some embodiments, a minimum of the horizontal spacing distance H of the stacked nanosheet FET semiconductor device 200 may be limited to a minimum distance required to form the gate dielectric material 320, the work function tuning metal layer 330, and the low resistance gate metal layer 340 between horizontally adjacent ones of the plurality of nanosheets 210.

An effective channel conduction width of the stacked nanosheet FET semiconductor device 200 may be approximately equal to a sum of lengths of the surfaces of the plurality of nanosheets 210 that are surrounded by the low resistance gate material metal layer 240. For example, in some embodiments, the effective channel conduction width of the stacked nanosheet FET semiconductor device 200 may be approximately equal to a sum of lengths of the top, bottom, and sidewall surfaces of the plurality of nanosheets 210 that are surrounded by the low resistance gate material metal layer 240.

In some embodiments, the horizontal spacing distance H of the stacked nanosheet FET semiconductor device 200 may be less than a horizontal spacing distance of conventional vertical finFET semiconductor devices. In some embodiments, the reduced horizontal spacing distance H of the stacked nanosheet FET semiconductor device 200 may provide a smaller layout area per effective channel conduction width than equivalent conventional vertical finFET semiconductor devices. The horizontal spacing distance 11 may be minimized to enable a larger effective conduction channel width per layout area. In other words, the nanosheet FET semiconductor device 200 may provide a greater effective channel conduction width than equivalent conventional vertical finFET semiconductor devices with an equal layout area. The enablement of the larger effective conduction channel width may be increased as a thickness of each nanosheet 210 is decreased, which may enable more vertically stacked channel patterns to be provided.

Figure 6:
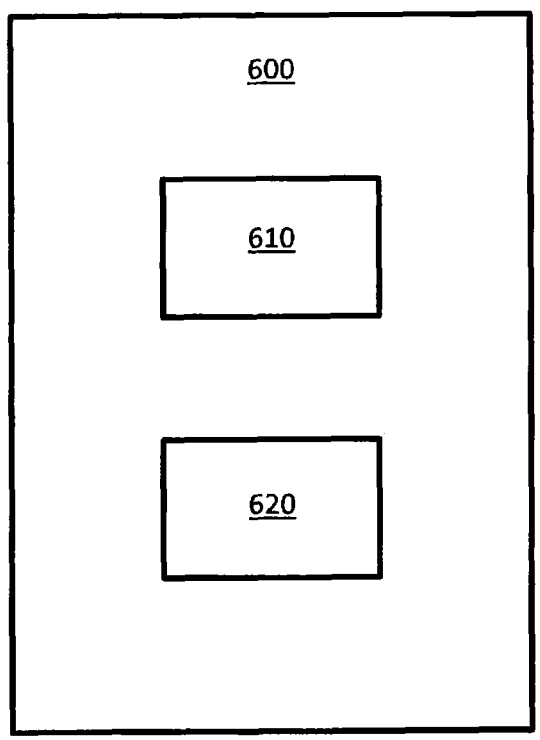
FIG. 6 is a block diagram schematically illustrating a semiconductor device including two stacked nanosheet FETs according to some embodiments of the inventive concept.

In some embodiments, the stacked nanosheet FET semiconductor device 200 may include an n-type FET and/or a p-type FET. In sonic embodiments, a stacked nanosheet FET semiconductor device may include more than one stacked nanosheet FET. Reference is now made to FIG. 6, which is a block diagram schematically illustrating a semiconductor device including two stacked nanosheet FETs according to some embodiments of the inventive concept. Referring to FIGS. 2A-2C and FIG. 6, in some embodiments, a stacked nanosheet FET semiconductor device 600 may include an n-type stacked nanosheet FET 610 and a p-type stacked nanosheet FET 620. One or both of the n-type stacked nanosheet FET 610 and the p-type stacked nanosheet FET 620 may be a stacked nanosheet FET as described with regard to FIGS. 2A-2C, or other embodiments of the inventive concept.

In some embodiments, the top and bottom surfaces of the nanosheets 210 of the n-type stacked nanosheet FET may have a first surface orientation and the top and bottom surfaces of the nanosheets 210 of the p-type stacked nanosheet FET may have a second surface orientation. The first surface orientation may be the same as the second surface orientation, and/or may be different. For example, in some embodiments, the first surface orientation and the second surface orientation may each be (110). In some embodiments, the first surface orientation may be (100) or (111) and the second orientation may be (110). In some embodiments, the nanosheets may include Si and/or Ge and the first surface orientation and the second surface orientation may each be (110). In some embodiments, the nanosheets may include Si and the first surface orientation may be (100) and the second orientation may be (110). In some embodiments, the nanosheets may include Ge and the first surface orientation may be (111) and the second orientation may be (110).

Figure 3:
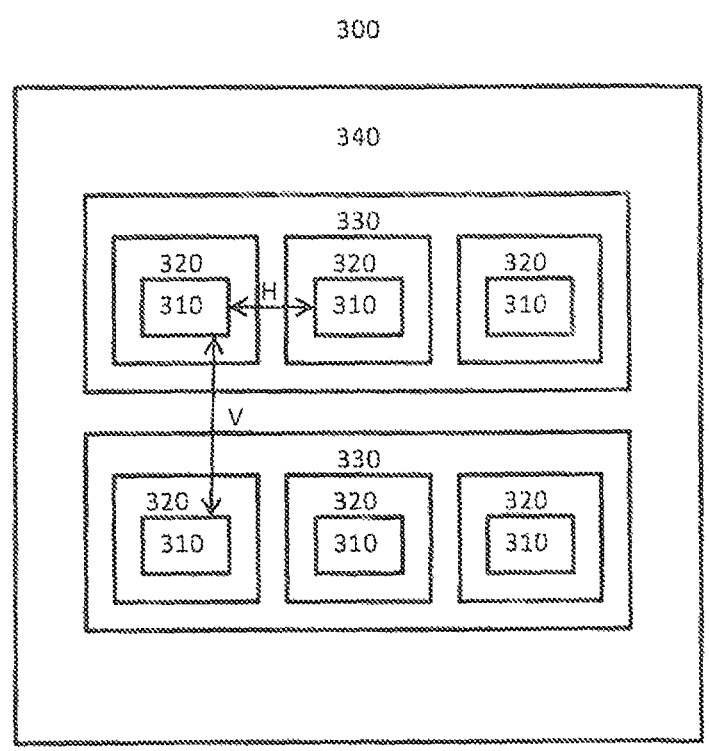
FIG. 3 is a cross-sectional view schematically illustrating a stacked nanosheet FET semiconductor device according to some embodiments of the inventive concept.

Reference is now made to FIG. 3, which is a cross-sectional view schematically illustrating a stacked nanosheet FET semiconductor device according to some embodiments of the inventive concept. Referring to FIGS. 2A-3, a stacked nanosheet FET semiconductor device 300 may be substantially similar to the stacked nanosheet FET semiconductor device 200 of FIGS. 2A-2C except for differences as described below. Descriptions of similar elements may be omitted for brevity. For example, in some embodiments, the stacked nanosheet FET semiconductor device 300 may include a plurality of vertically stacked channel patterns including a plurality of nanosheets 310 that may be similar to the plurality of vertically stacked channel patterns including the plurality of nanosheets 210 of the stacked nanosheet FET semiconductor device 200, as discussed above with reference to FIGS. 2A-2C. Further, in some embodiments, the stacked nanosheet FET semiconductor device 300 may include a gate stack including a gate dielectric material 320, a work function tuning metal layer 330, and a low resistance gate metal layer 340 that may be similar to the gate stack including the gate dielectric material 220, the work function tuning metal layer 230, and the low resistance gate metal layer 240, as discussed above with reference to FIGS. 2A-2C.

in some embodiments, the gate stack of the nanosheet FET semiconductor device 300 may not include the low resistance gate metal layer 340 between horizontally adjacent ones of the plurality of nanosheets 310. In other words, in some embodiments, the work function tuning metal layer 330 may extend substantially continuously between the horizontal adjacent ones of the plurality of nanosheets 310. Therefore, in some embodiments, the nanosheet FET semiconductor device 300 may include a reduced subset of the gate stack, including the gate dielectric material 320 and the work function tuning metal layer 330, in horizontal spacing regions between adjacent ones of the plurality of nanosheets 310 and may include the full gate stack, including the gate dielectric material 320, the work function tuning metal layer 330, and the low resistance gate metal layer 340, in vertical spacing regions between adjacent ones of the plurality of vertically stacked channel patterns. In some embodiments, ones of the vertically stacked channel patterns of the nanosheet FET semiconductor device 300 may include at least three nanosheets, but the inventive concept is not limited thereto.

in some embodiments, the nanosheet FET semiconductor device 300 without the low resistance gate metal layer 340 between horizontally adjacent ones of the plurality of nanosheets 310 may have a smaller minimum horizontal spacing distance than the nanosheet FET semiconductor device 200 of FIGS. 2A-2C that includes the low resistance gate metal layer 240 between horizontally adjacent ones of the plurality of nanosheets 210. In some embodiments, the reduced horizontal spacing distance H of the stacked nanosheet FET semiconductor device 300 may provide a smaller layout area per effective channel conduction width than an equivalent nanosheet FET semiconductor device 200.

In some embodiments, an increase of gate resistance associated with the lack of the low resistance gate metal layer 340 in the horizontal spacing regions may be small, because a height of the missing low resistance gate metal layer 340 and/or 440 may be much smaller than a height of vertical fins of conventional vertical finFET semiconductor devices. Therefore, a contribution of gate resistance to lowering of AC performance may be much smaller for nanosheet FETs than finFETs. Therefore, the reduced gate stack of the horizontal spacing regions may not significantly degrade a performance of the nanosheet FET semiconductor device 300, unlike conventional vertical finFET semiconductor devices.

Figure 4:
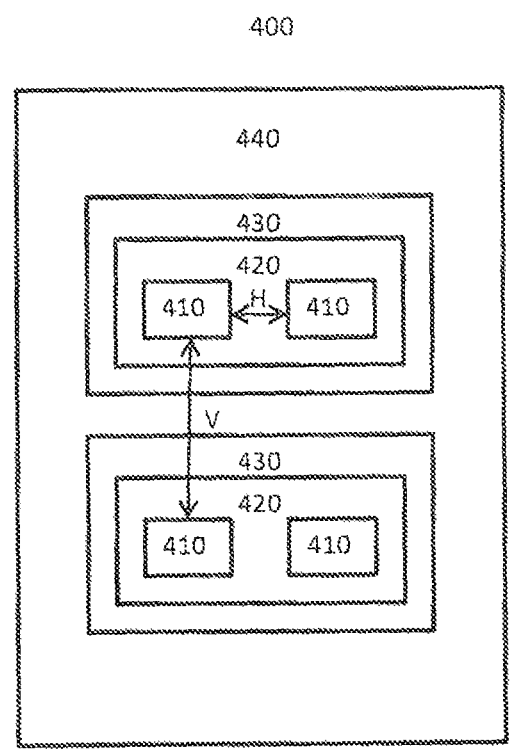
FIG. 4 is a cross-sectional view schematically illustrating a stacked nanosheet FET semiconductor device according to some embodiments of the inventive concept.

Reference is now made to FIG. 4, which is a cross-sectional view schematically illustrating a stacked nanosheet FET semiconductor device according to some embodiments of the inventive concept. Referring to FIGS. 2A-4, a stacked nanosheet semiconductor device 400 may be substantially similar to the stacked nanosheet FET semiconductor devices 200 and 300 of FIGS. 2A-2C and FIG. 3, respectfully, except for differences as described below. Descriptions of similar elements may be omitted for brevity. For example, in some embodiments, the stacked nanosheet FET semiconductor device 400 may include a plurality of vertically stacked channel patterns including a plurality of nanosheets 410 that may be similar to the plurality of vertically stacked channel patterns including the plurality of nanosheets 210 of the stacked nanosheet FET semiconductor device 200, as discussed above with reference to FIGS. 2A-2C, Further, in some embodiments, the stacked nanosheet FET semiconductor device 400 may include a gate stack including a gate dielectric material 420, a work function tuning metal layer 430, and a low resistance gate metal layer 440 that may be similar to the gate stack including the gate dielectric material 220, the work function tuning metal layer 230, and the low resistance gate metal layer 240 of the stacked nanosheet FET semiconductor device 200, as discussed above with reference to FIGS. 2A-2C.

In some embodiments, the gate stack of the nanosheet FET semiconductor device 400 may not include the low resistance gate metal layer 440 and the work function tuning metal layer 430 between horizontally adjacent ones of the plurality of nanosheets 410. In other words, in some embodiments, the gate dielectric material 420 may extend substantially continuously between the horizontally adjacent ones of the plurality of nanosheets 410. Therefore, in some embodiments, the nanosheet FET semiconductor device 400 may include a reduced subset of the gate stack, including the gate dielectric material 420, in horizontal spacing regions between adjacent ones of the plurality of nanosheets 410 and may include the full gate stack, including the gate dielectric material 420, the work function tuning metal layer 430, and the low resistance gate metal layer 440, in vertical spacing regions between adjacent ones of the plurality of vertically stacked channel patterns. In some embodiments, ones of the vertically stacked channel patterns of the nanosheet FET semiconductor device 400 may include two nanosheets, but the inventive concept is not limited thereto.

An effective channel conduction width of the stacked nanosheet FET semiconductor device 400 may include a component that is approximately equal to a sum of lengths of the surfaces of the plurality of nanosheets 410 that are surrounded by the low resistance gate material metal layer 440. For example, in some embodiments, the effective channel conduction width of the stacked nanosheet FET semiconductor device 400 may include a component that is approximately equal to a sum of lengths of the top and bottom surfaces of the plurality of nanosheets 410. In some embodiments, the effective channel conduction width of the stacked nanosheet FET semiconductor device 400 may also include a component that is approximately equal to the sum of the outer sidewall surfaces of outermost ones of the plurality of nanosheets 410 within ones of the plurality of vertically stacked channel patterns. In some embodiments, the effective channel conduction width of the stacked nanosheet FET semiconductor device 400 may include an additional component of effective channel conduction width that is greater than zero and less than a sum of lengths of inner sidewall surfaces of ones of the plurality of nanosheets 410. The additional component of effective channel conduction may be provided by a coupling of the gate to the interior edges of the plurality of nanosheets 410.

In some embodiments, the nanosheet FET semiconductor device 400 without the low resistance gate metal layer 440 and the work function tuning metal layer 430 between horizontally adjacent ones of the plurality of nanosheets 410 may have a smaller minimum horizontal spacing distance than the nanosheet FET semiconductor device 200 of FIGS. 2A-2C and the nanosheet FET semiconductor device 300 of FIG. 3. In some embodiments, the reduced horizontal spacing distance H of the stacked nanosheet FET semiconductor device 400 may provide a smaller layout area per effective channel conduction width than an equivalent nanosheet FET semiconductor device 300.

In some embodiments, the nanosheet FET semiconductor device 400 without the low resistance gate metal layer 440 and the work function tuning metal layer 430 between horizontally adjacent ones of the plurality of nanosheets 410 may still provide a gate control of a channel potential along an edge of ones of the plurality of nanosheets 410 adjacent to the horizontal spacing regions due at least to the gate being operable at both the top surfaces and bottom surfaces of the ones of the plurality of nanosheets 410. Therefore, a gate control of the nanosheet FET semiconductor device 400 without the low resistance gate metal layer 440 and the work function tuning metal layer 430 between horizontally adjacent ones of the plurality of nanosheets 410 may be no worse than conventional vertical finFET semiconductor devices formed on insulating substrates.

Figure 5:
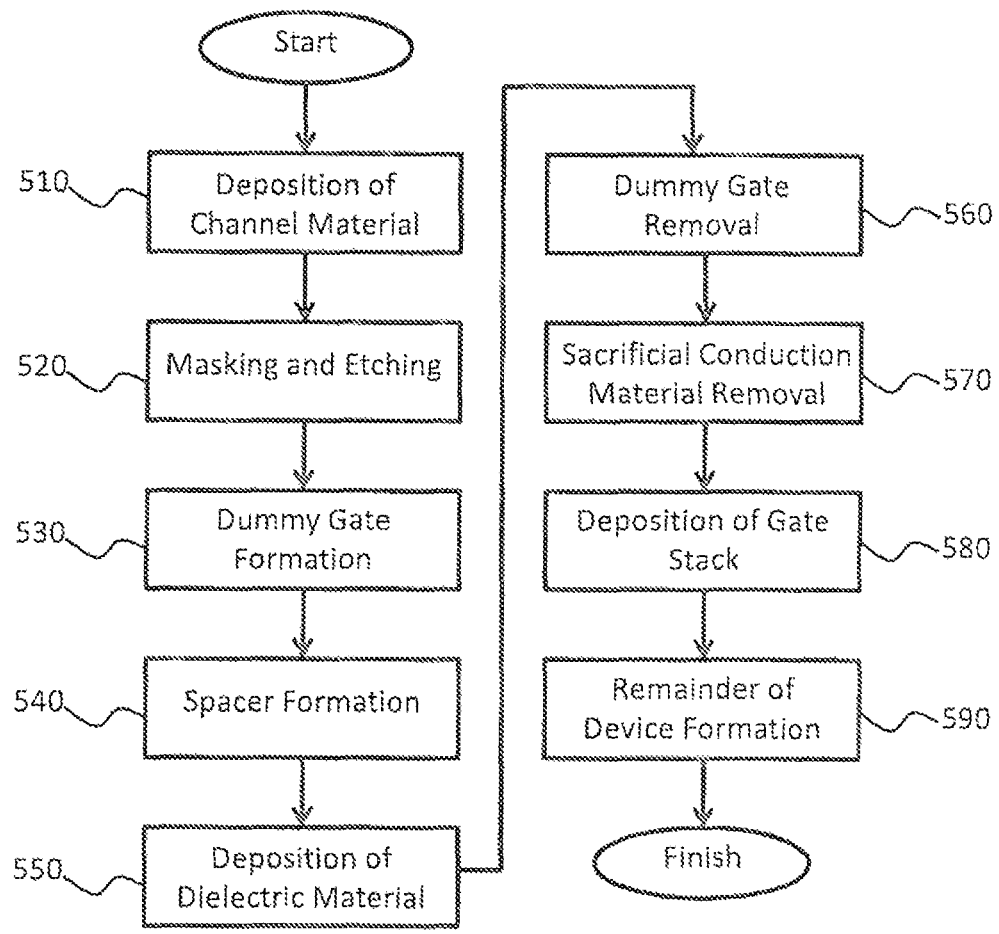
FIG. 5 is a flowchart illustrating operations in methods of manufacturing stacked nanosheet FET semiconductor devices according to some embodiments of the inventive concept.

Reference is now made to FIG. 5, which is a flowchart illustrating operations in methods of manufacturing stacked nanosheet FET semiconductor devices according to some embodiments of the inventive concept. The methods will be described with reference to the stacked nanosheet FET semiconductor device 200 of FIGS. 2A-2C. However, in some embodiments, the described methods of manufacturing stacked nanosheet FET semiconductor devices may produce the stacked nanosheet FET semiconductor device 300 of FIG. 3, the stacked nanosheet FET semiconductor device 400 of FIG. 4, and/or stacked nanosheet FET semiconductor devices according to other embodiments of the inventive concept.

Referring to FIGS. 2A-2C and FIG. 5, in some embodiments, methods of forming the stacked nanosheet FET semiconductor device 200 may include a stacked layer-by-layer deposition of alternating layers of conduction channel material interspersed by sacrificial conduction material (block 510), In some embodiments, the final stacked nanosheet semiconductor device 200 may be an n-type FET, the conduction channel material may include Si, and the sacrificial conduction material may include SiGe. In some embodiments, the final stacked nanosheet semiconductor device 200 may be a p-type FET, the conduction channel material may include SiGe, and the sacrificial conduction material may include Si. However, the inventive concept is not limited to these combinations of materials. A thickness of the sacrificial conduction material may determine the vertical spacing distance V of the final stacked nanosheet semiconductor device 200. In some embodiments, the methods may include a protective masking layer formation to provide for independent formation of n-type FET and p-type FET stacked layers. Similarly, in some embodiments, n-type. FETs and p-type FETs may be formed by separate masking, etching and/or deposition steps.

The methods may include patterning and etching the stacked layers into desired dimensions (block 520), defining the width of ones of the plurality of nanosheets 210 and the horizontal spacing distance H between adjacent ones of the plurality of nanosheets 210. In some embodiments, the patterning and etching of the stacked layers may define a length of the plurality of nanosheets 210. A single mask step and etch step, and/or multiple mask steps and etch steps, may be used to define the width of ones of the plurality of nanosheets 210 and the horizontal spacing distance H between adjacent ones of the plurality of nanosheets 210 in each horizontal plane. An etch, for example a dry etch, that is not selective to either of the conduction channel material and/or the sacrificial conduction material may be utilized, although a multiple-etch process, using different etch gas chemistries to selectively etch each of the conduction channel material and sacrificial conduction material may also be utilized.

The methods may include processes including, for example, dummy gate formation (block 530), external and/or internal spacer formation (block 540), dielectric material deposition (block 550), dummy gate removal (block 560), and/or sacrificial conduction material removal (block 570). In some embodiments, the sacrificial conduction material may be removed by a wet etch process and/or a combination wet/dry etch process. The resultant conduction channel nanosheets 210 may be supported by the spacers remaining alter the dummy gate removal. After the dummy gate removal, the resultant conduction channel nanosheets 210 may define the final horizontal spacing distance H and vertical spacing distance V.

In some embodiments, the methods may include a Ge condensation process to form Ge nanosheets, for example by processes including SiGe deposition, oxidation, and oxide strip.

In some embodiments, the methods may include epitaxial growth from a starting material on an insulator and a separate epitaxial growth from a bulk substrate to form nanosheets including channel materials not of the same group, for example group IV and group III-V semiconductor materials, and/or not of the same surface orientation.

The methods may include deposition of the gate stack (block 580). For example, the methods may include deposition of the gate dielectric material 220, the work function tuning metal layer 230, and/or the low resistance gate metal layer 240. In some embodiments the deposition done or more of the gate dielectric material 220, work function tuning metal layer 230, and low resistance gate metal layer 240 may include atomic-layer deposition. The gate stack may be uniformly formed on all exposed surfaces of the separated nanosheets 210. in some embodiments, one or more portions of the gate stack may not be formed in the horizontal spacing regions between adjacent ones of the nanosheets 210.

The methods may include forming the remainder of the stacked nanosheet FET semiconductor device 200 and/or a circuit including nanosheet FETs (block 590) by processes including, for example, CMP steps to enable gate metal only in the removed dummy gate regions, contact formation, and/or BEOL formation.

While the inventive concept has been described with reference to some embodiments, it will be apparent to those skilled in the art that various changes and modifications may be made without departing from the spirit and scope of the inventive concept. it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A device comprising a field effect transistor (FET), the FET comprising:
   a substrate;
   a first channel pattern on the substrate, the first channel pattern comprising a first plurality of nanosheets arranged in a first horizontal plane that is parallel to a surface of the substrate, the first plurality of nanosheets spaced apart from each other in a first direction that is parallel to the surface of the substrate at a horizontal spacing distance between adjacent ones of the first plurality of nanosheets;
   a second channel pattern on the first channel pattern and spaced apart from the first channel pattern in a second direction that is perpendicular to the surface of the substrate at a vertical spacing distance from the first channel pattern to the second channel pattern that is greater than the horizontal spacing distance, the second channel pattern comprising a second plurality of nanosheets arranged in a second horizontal plane that is parallel to the surface of the substrate, the second plurality of nanosheets spaced apart from each other in the first direction at the horizontal spacing distance between adjacent ones of the second plurality of nanosheets;

a gate that is configured to surround portions of the first channel pattern and portions of the second channel pattern; and source/drain regions on opposing ends of the first channel pattern and second channel pattern, ones of the source/drain regions connected to a respective end of the first channel pattern and a respective corresponding end of the second channel pattern, wherein the gate comprises a gate dielectric material that is configured to surround portions of ones of the first plurality of nanosheets and portions of ones of the second plurality of nanosheets, wherein the gate comprises a work function tuning metal layer that is configured to surround portions of the gate dielectric material, the work function tuning metal layer being configured to control a work function of the FET, the work function tuning metal comprising a first continuous perimeter that surrounds four sides of the first channel pattern and a second continuous perimeter that surrounds four sides of the second channel pattern, and wherein the gate comprises a low resistance gate metal layer on the work function tuning metal layer that surrounds the first and second continuous perimeters of the work function tuning metal and is between the first and second continuous perimeters of the work function tuning metal.

2. The device of claim 1, wherein ones of the first plurality of nanosheets and ones of the second plurality of nanosheets comprise a ratio of width in the first direction to height in the second direction of at least 1:1.

3. The device of claim 2, wherein ones of the first plurality of nanosheets and ones of the second plurality of nanosheets comprise a ratio of width in the first direction to height in the second direction of at least 2:1.

4. The device of claim 1, wherein ones of the first plurality of nanosheets and ones of the second plurality of nanosheets comprise a height in the second direction in a range of about 2 nm to about 8 nm.

5. The device of claim 4, wherein ones of the first plurality of nanosheets and ones of the second plurality of nanosheets comprise a height in the second direction in a range of about 3 nm to about 6 nm.

6. The device of claim 1,
wherein the work function tuning metal layer extends substantially continuously between adjacent ones of the first plurality of nanosheets and extends substantially continuously between adjacent ones of the second plurality of nanosheets,
wherein the first channel pattern comprises at least three nanosheets, and
wherein the second channel pattern comprises at least three nanosheets.

7. The device of claim 1, wherein the FET is an n-type FET, the device further comprising a p-type FET, the p-type FET comprising:
a third channel pattern on the substrate, the third channel pattern comprising a third plurality of nanosheets spaced apart from each other at a second horizontal spacing distance between adjacent ones of the first plurality of nanosheets; and
a fourth channel pattern on the third channel pattern and spaced apart from the third channel pattern in the second direction at a second vertical spacing distance from the third channel pattern to the fourth channel pattern that is greater than the second horizontal spacing distance, the fourth channel pattern comprising a fourth plurality of nanosheets spaced apart from each other at the second horizontal spacing distance between adjacent ones of the fourth plurality of nanosheets,
wherein the nanosheets of the first through fourth channel patterns comprise Si, SiGe, Ge, or a group III-V semiconductor material,
wherein top and bottom surfaces of the nanosheets of the first channel pattern and second channel pattern comprise a first surface orientation, and
wherein top and bottom surfaces of the nanosheets of the third channel pattern and the fourth channel pattern comprise a second surface orientation.

8. The device of claim 7, wherein the first surface orientation is the same as the second surface orientation.

9. The device of claim 8, wherein the first surface orientation and second surface orientation are (110).

10. The device of claim 7, wherein the first surface orientation is different from the second surface orientation.

11. The device of claim 10, wherein the first surface orientation is (100) or (111) and the second surface orientation is (110).

12. A device comprising a field effect transistor (FET), the FET comprising:
a substrate;
a first channel pattern on the substrate, the first channel pattern comprising a first plurality of nanosheets arranged in a first horizontal plane that is parallel to a surface of the substrate, the first plurality of nanosheets spaced apart from each other in a first direction that is parallel to the surface of the substrate at a horizontal spacing distance between adjacent ones of the first plurality of nanosheets;
a second channel pattern on the first channel pattern and spaced apart from the first channel pattern in a second direction that is perpendicular to the surface of the substrate at a vertical spacing distance from the first channel pattern to the second channel pattern that is greater than the horizontal spacing distance, the second channel pattern comprising a second plurality of nanosheets arranged in a second horizontal plane that is parallel to the surface of the substrate, the second plurality of nanosheets spaced apart from each other in the first direction at the horizontal spacing distance between adjacent ones of the second plurality of nanosheets;
a gate that is configured to surround portions of the first channel pattern and portions of the second channel pattern; and
source/drain regions on opposing ends of the first channel pattern and second channel pattern, ones of the source/drain regions connected to a respective end of the first channel pattern and a respective corresponding end of the second channel pattern,
wherein the gate comprises:
a gate dielectric material that is configured to surround portions of ones of the first plurality of nanosheets and portions of ones of the second plurality of nanosheets; and
a low resistance gate metal layer on the gate dielectric material that is configured to surround portions of the first channel pattern and portions of the second channel pattern, and
wherein the gate dielectric material extends substantially continuously between adjacent ones of the first plurality of nanosheets and extends substantially continuously between adjacent ones of the second plurality of nanosheets.

13. The device of claim 12, wherein the gate further comprises a work function tuning metal layer between the low resistance gate metal layer and the gate dielectric material, and that is configured to control a work function of the FET.

14. The device of claim 13,
wherein the first channel pattern comprises two nanosheets, and
wherein the second channel pattern comprises two nanosheets.

15. A field effect transistor (FET), comprising:
a substrate;
a first channel pattern on the substrate, the first channel pattern comprising a first plurality of nanosheets arranged in a first horizontal plane that is parallel to a surface of the substrate, the first plurality of nanosheets spaced apart from each other in a first direction that is parallel to the surface of the substrate;
a second channel pattern on the first channel pattern and spaced apart from the first channel pattern in a second direction that is perpendicular to the surface of the substrate, the second channel pattern comprising a second plurality of nanosheets arranged in a second horizontal plane that is parallel to the surface of the substrate, the second plurality of nanosheets spaced apart from each other in the first direction;
a gate that is configured to surround portions of the first channel pattern and portions of the second channel pattern, the gate comprising a gate dielectric material that is configured to surround portions of ones of the first plurality of nanosheets and portions of ones of the second plurality of nanosheets and a low resistance gate metal layer on the gate dielectric material that is configured to surround portions of the first channel pattern and portions of the second channel pattern, the gate dielectric material being configured to extend substantially continuously between adjacent ones of the first plurality of nanosheets and being configured to extend substantially continuously between adjacent ones of the second plurality of nanosheets; and
source/drain regions on opposing ends of the first channel pattern and second channel pattern, ones of the source/drain regions connected to a respective end of the first channel pattern and a respective corresponding end of the second channel pattern.

16. The device of claim 15,
wherein the first channel pattern comprises two nanosheets, and
wherein the second channel pattern comprises two nanosheets.

17. A field effect transistor (FET), comprising:
a substrate;
a first channel pattern on the substrate, the first channel pattern comprising a first plurality of nanosheets arranged in a first horizontal plane that is parallel to a surface of the substrate, the first plurality of nanosheets spaced apart from each other in a first direction that is parallel to the surface of the substrate;
a second channel pattern on the first channel pattern and spaced apart from the first channel pattern in a second direction that is perpendicular to the surface of the substrate, the second channel pattern comprising a second plurality of nanosheets arranged in a second horizontal plane that is parallel to the surface of the substrate, the second plurality of nanosheets spaced apart from each other in the first direction;
a gate that is configured to surround portions of the first channel pattern and portions of the second channel pattern, the gate comprising a gate dielectric material that is configured to surround portions of ones of the first plurality of nanosheets and portions of ones of the second plurality of nanosheets, a work function tuning metal layer that is configured to surround portions of the gate dielectric material and configured to control a work function of the FET, and a low resistance gate metal layer on the work function tuning metal layer that is configured to surround portions of the first channel pattern and portions of the second channel pattern, the work function tuning metal layer being configured to extend substantially continuously between adjacent ones of the first plurality of nanosheets and being configured to extend substantially continuously between adjacent ones of the second plurality of nanosheets; and
source/drain regions on opposing ends of the first channel pattern and second channel pattern, ones of the source/drain regions connected to a respective end of the first channel pattern and a respective corresponding end of the second channel pattern,
wherein the work function tuning metal layer comprises a first perimeter that surrounds the first plurality of nanosheets and a second perimeter that surrounds the second plurality of nanosheets, and
wherein a portion of the low resistance gate metal layer is between the first and second perimeters of the work function tuning metal layer.

18. The FET of claim 17,
wherein the first channel pattern comprises at least three nanosheets, and
wherein the second channel pattern comprises at least three nanosheets.

* * * * *